United States Patent
Alves

(10) Patent No.: US 10,837,099 B2
(45) Date of Patent: Nov. 17, 2020

(54) IMPREGNATION METHOD

(71) Applicant: Ford Global Technologies, LLC, Dearborn, MI (US)

(72) Inventor: Bruno Alves, Huerth (DE)

(73) Assignee: Ford Global Technologies, LLC, Dearborn, MI (US)

(*) Notice: Subject to any disclaimer, the term of this patent is extended or adjusted under 35 U.S.C. 154(b) by 106 days.

(21) Appl. No.: 15/947,101

(22) Filed: Apr. 6, 2018

(65) Prior Publication Data

US 2018/0298486 A1   Oct. 18, 2018

(30) Foreign Application Priority Data

Apr. 12, 2017   (DE) .................. 10 2017 206 315

(51) Int. Cl.

| | |
|---|---|
| *B05D 1/18* | (2006.01) |
| *C23C 14/22* | (2006.01) |
| *B05C 3/02* | (2006.01) |
| *C23C 16/442* | (2006.01) |
| *B29B 15/12* | (2006.01) |
| *B29C 64/10* | (2017.01) |
| *B22F 3/26* | (2006.01) |
| *C23C 14/50* | (2006.01) |

(Continued)

(52) U.S. Cl.
CPC ............. *C23C 14/223* (2013.01); *B05C 3/02* (2013.01); *B22F 3/26* (2013.01); *B29B 15/125* (2013.01); *B29C 64/10* (2017.08); *C23C 16/442* (2013.01); *B22F 3/1055* (2013.01); *B22F 2202/01* (2013.01); *B22F 2998/10* (2013.01); *B29B 15/10* (2013.01); *B29C 64/205* (2017.08); *B33Y 10/00* (2014.12); *B33Y 30/00* (2014.12); *C23C 14/50* (2013.01)

(58) Field of Classification Search
CPC ............................... B05D 3/0486; B05D 1/18
See application file for complete search history.

(56) References Cited

U.S. PATENT DOCUMENTS 3,842,796 A * 10/1974 Hilditch ............... B27K 3/0207
                                                            118/50
4,196,231 A *  4/1980 Hubers ..................... B04B 3/00
                                                            118/423

(Continued)

FOREIGN PATENT DOCUMENTS

DE      1809825        6/1970
DE      3229652 A *    8/1982     ........ C08F 299/0421

(Continued)

OTHER PUBLICATIONS

English Translation of DE3229652A. (Year: 2020).*
Germanovich, et al., I.M. Powder Metall Met Ceram (1964) 1: 375. Available at URL https://doi.org/10.1007/BF00774122.

*Primary Examiner* — Hai Y Zhang
(74) *Attorney, Agent, or Firm* — Burris Law, PLLC

(57) ABSTRACT

The present disclosure provides an impregnation method that includes the steps of providing a workpiece to be impregnated, placing the workpiece in a bath of impregnating agent inside a vessel, and oscillating movement of a vibrating body inside the vessel during an impregnation period. The vibrating body creates oscillating pressure changes inside the bath by acting on the bath. the method further includes removing the workpiece from the bath after the impregnation period.

10 Claims, 2 Drawing Sheets

Figure 1:
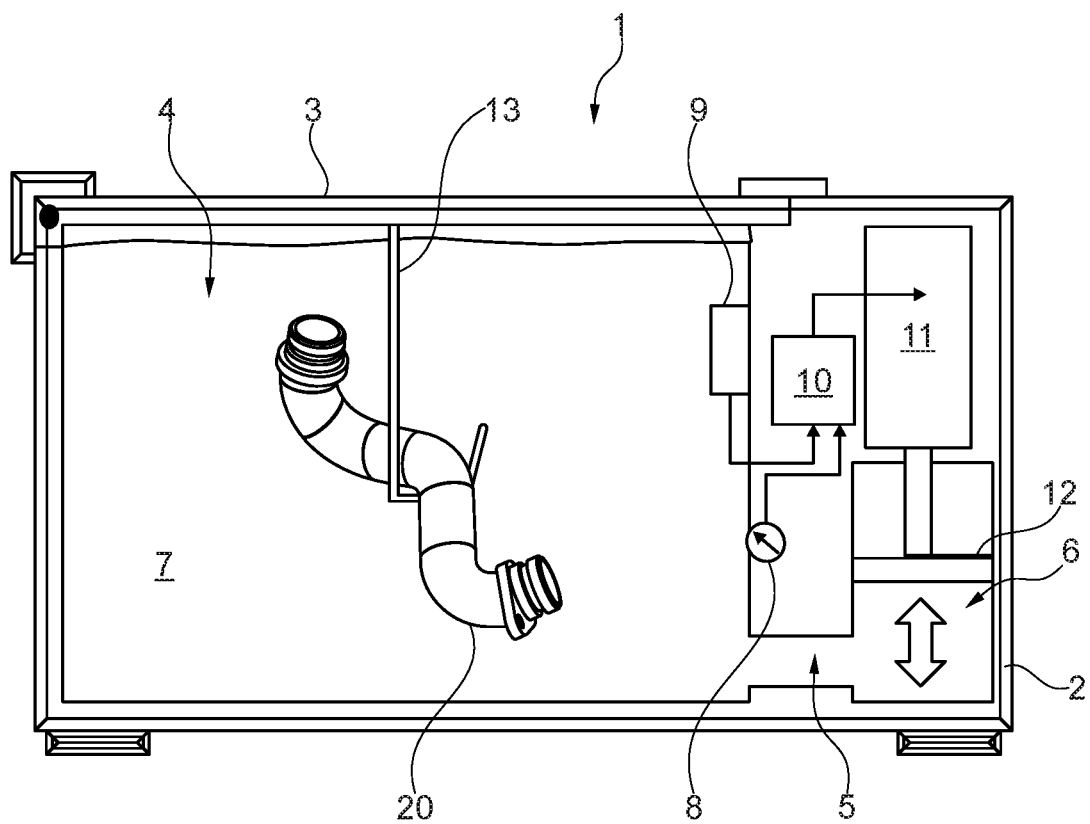

(51) Int. Cl.
*B33Y 10/00* (2015.01)
*B33Y 30/00* (2015.01)
*B29C 64/205* (2017.01)
*B29B 15/10* (2006.01)
*B22F 3/105* (2006.01)

(56) References Cited

U.S. PATENT DOCUMENTS

| | | | | |
|---|---|---|---|---|
| 5,288,521 | A * | 2/1994 | Maldaner | B27K 3/08 427/238 |
| 7,503,976 | B2 * | 3/2009 | Gilmore | B05C 3/02 118/52 |
| 2005/0065260 | A9 * | 3/2005 | Kolarik | B28B 11/04 524/443 |
| 2005/0244586 | A1 * | 11/2005 | An | B27K 3/02 427/457 |

FOREIGN PATENT DOCUMENTS

| EP | 0100474 | 2/1984 |
|---|---|---|
| EP | 0172304 | 2/1986 |

\* cited by examiner

IMPREGNATION METHOD

CROSS-REFERENCE TO RELATED APPLICATIONS

This application claims priority to and the benefit of DE 102017206315.7 filed on Apr. 12, 2017. The disclosure of the above application is incorporated herein by reference.

FIELD

The present disclosure relates to method of impregnating material into a final part.

BACKGROUND

The statements in this section merely provide background information related to the present disclosure and may not constitute prior art.

Today, there are various methods in existence by means of which three-dimensional models of shapeless or shape-neutral materials such as powders or liquids can be produced on the basis of design data. These additive manufacturing methods are also known by the general term of "Rapid Prototyping." Oftentimes a transformation step takes place, during which the initial material is either present in the liquid state from the start or is liquefied in the meantime and hardened at a predetermined place. One known method for this is so-called melt coating or fused deposition modeling (FDM), in which a workpiece is built up layer by layer from thermoplastic material. The plastic is supplied, e.g., in powder or strand form, melted, and applied in the molten state by a pressure head, which deposits one after another individual, usually horizontal layers of the object being made. In addition, methods are known in which a powder-like material, such as a plastic, is deposited layer-by-layer and hardened selectively by means of a locally deposited or imprinted binding agent. In yet other methods, such as selective laser sintering (SLS), a powder is applied layer by layer, for example with the aid of a doctor blade, to a base plate. The powder is selectively heated by means of a suitable focused radiation, such as a laser beam, and thereby sintered. After the building of a layer, the base plate is slightly lowered and a new layer is deposited. The powder which can be used for this is plastics, ceramics, or metals. In a similar method, selective laser melting (SLM), the amount of energy introduced by the radiation is so large that the powder is melted for a portion and congeals to form a cohesive solid.

A particular advantage of additive manufacturing methods is their great flexibility, i.e., components with almost any desired three-dimensional geometry can be manufactured within a relatively short time, which can also be advantageous e.g. for the manufacturing of prototypes or small quantities. However, because of the process, the additively manufactured component often has a porous structure, so that it is not gas-tight or even liquid-tight. If such properties are needed, e.g., for the testing of a prototype, the component can be impregnated afterwards in order to produce the corresponding tightness.

In the context of known impregnation methods, first of all the air is removed from the pores inside the workpiece, usually by creating a (partial) vacuum, in order to facilitate the infiltration of the impregnating agent. In so-called dry vacuum methods, the evacuating occurs before the part is dipped into the impregnating agent, and in wet vacuum methods after the dipping is done. Optionally, the impregnating agent with the workpiece dipped into it can be subjected to an excess pressure in order to hasten the impregnation process. These different methods basically work well, but are associated with high energy input and can only be carried out with large technical expense. In particular, the change from vacuum to excess pressure makes the known methods costly. Also, the time needed for a successful impregnation may amount to several hours in some instances.

The article "Ultrasonic impregnation of porous sintered components" (in "Soviet Powder Metallurgy and Metal Ceramics" September 1964, Vol. 1, No. 5, pp. 375-378) discloses the assisting of an impregnation process by the action of ultrasound. In this process, porous parts among other things are impregnated with machine oil or molten metal.

U.S. Pat. No. 5,288,521 A discloses an impregnation method for workpieces of porous material. The workpiece is placed in an autoclave, which is then sealed and evacuated. After this, an impregnating agent is introduced into the autoclave, so that the workpiece is covered by it. During the impregnation, the autoclave is placed in vibration by means of a vibrator, which is meant to accomplish a decreasing of the impregnation time.

U.S. Patent Application No. 2005/0065260 A1 discloses a method for producing an object for ornamental or architectonic use. A base body of porous stone is placed in a vessel and covered with an impregnating agent. The impregnating agent is then hardened and the impregnated object is machined. In the course of the impregnation, the base body can be evacuated by placing the vessel in a vacuum chamber. Optionally, the vessel may also be placed in slight vibration, which is advantageous in many cases.

U.S. Pat. No. 3,842,796 discloses a device for treating wood, textiles and other substances, during which a treatment chamber is divided into a lower part to receive a treatment agent and an upper part. A carrier for the material being treated can move by means of lifting devices between the upper and the lower part of the treatment chamber in order to dip the material being treated into a treatment agent located in the lower part and then return it to the upper part of the treatment chamber. The pressure in the treatment chamber can be changed with respect to the surrounding pressure, and in particular it may be provided that a partial vacuum is created before the dipping into the treatment agent. According to one embodiment, this partial vacuum may have an oscillating action.

U.S. Patent Application Publication No. 2005/0244586 A1 discloses an impregnation method for wooden workpieces, in which at first the surface of the workpiece is covered with a thin coat of impregnating agent. After this, a sonic generator is positioned such that it dips into the coating, but without touching the workpiece, with a particular angle between the direction of propagation of the sound and the direction of the wood grain being preferred. In a comparison experiment, the workpiece is dipped entirely into impregnating agent and subjected to ultrasound.

EP 0 172 304 A2 discloses a device for the impregnating of porous parts, or cast or sintered metal parts, with a liquid impregnating agent. The parts being impregnated are contained in a basket with permeable wall, which is placed in the upper part of a tightly sealed vessel in a rotationally supported centrifuge. In the lower part of the vessel is arranged a basin for the impregnating agent, which can travel upward so that the basket is dipped into the impregnating agent.

U.S. Pat. No. 4,196,231 A discloses an impregnation device, e.g., for electronic components or porous cast parts. This has an evacuable vessel for impregnating agent, at whose top end is arranged a mount for a spin basket. The mount consists of a single aligning bearing, which is held by a carrier which can be clamped by means of spreading devices to the upper edge of the vessel.

U.S. Pat. No. 7,503,976 B2 discloses a system for the impregnation of components, with an impregnating device as well as a centrifuging station arranged underneath. The impregnating device has a closable vessel with an entry opening in a sidewall. Inside the vessel is arranged a lifting device, on which is positioned a parts holder with parts being impregnated, before it is dipped by lowering of the lifting device into the impregnation liquid in the lower part of the vessel. The centrifuging station has a centrifuge carrier to hold impregnated parts, which is mounted and able to rotate by means of a first top bearing and a second bottom bearing.

In view of the cited prior art, the efficient impregnation of components, especially additively manufactured components, still has room for improvement.

SUMMARY

The present disclosure provides a method for efficient impregnation of components.

It should be pointed out that the individually listed features and measures in the following description may be combined with each other in any given, technically meaningful way and indicate further forms of the present disclosure. The description also characterizes and specifies the present disclosure in particular in connection with the figures.

The present disclosure provides an impregnation method. In a first step, a workpiece being impregnated is provided. In particular, it may be a workpiece which was manufactured at least in part by an additive manufacturing method. Different manufacturing methods may be used, such as FDM or SLS. The manufacturing method may be based on a particle-like material, such as a powder or granulate, which may include, by way of example, plastic, ceramic, or metal. Optionally, the start of the impregnation may also be preceded by a machining coming after the actual additive manufacturing method, such as cutting machining of the surface. In any case, the workpiece has a porous structure for at least a portion, making possible and desirable for certain purposes an impregnation, for example when a tightness to liquids or gases is desired. The workpiece may be a prototype, but the impregnation method according to the present disclosure is also expressly suitable for series production.

In a next step, the workpiece is placed into a bath of impregnating agent inside a vessel. Various forms are conceivable in which the workpiece is placed only partly in the bath, for example when only part of the workpiece needs to be impregnated. Normally, the workpiece is placed or submerged entirely. The placement is done at least in part automatically, according to one form of the present disclosure. Of course, the workpiece may be held by a holding device, such as a gripper, hook, basket, or the like. Optionally, such a holding device may also hold several workpieces at the same time. In order to place the workpiece in the bath of impregnating agent, the holding device may be moved into the vessel or the vessel may be moved up to the holding device. The impregnating agent serves for penetrating into the porous structure of the workpiece and closing up the cavities at least in part. The impregnating agent is at first liquid, but it can normally harden after the workpiece has been impregnated with it. Such a hardening may be initiated or accelerated, e.g., by contact with air, moisture, radiation, or other factors.

After the workpiece has been placed in the bath, an oscillating movement of a vibrating body occurs inside the vessel during an impregnation period, wherein the vibrating body creates oscillating pressure changes within the bath by acting on the bath. This expressly includes the possibility of the vibrating body already being moved in oscillation before and/or during the introducing of the workpiece. On the other hand, it is possible for the oscillating movement to occur not during the entire impregnation period, but rather to be interrupted, e.g., intermittently.

The movement of the vibrating body is oscillating, i.e., repeated changes of direction occur. The movement may be linear, but also a circular or elliptical movement is conceivable for example, which can be viewed as being a movement composed of two oscillating linear movements. The variation of the movement over time may correspond at least for an interval to a basic (sinusoidal) oscillation, but such a basic oscillation may also have harmonics superimposed on it. In particular, it is also possible for the frequency of the basic oscillation to vary over time. The same holds for the amplitude of movement of the vibrating body. The term "vibrating body" means that its movement can also be called a vibration. A certain time interval may occur between the placement of the workpiece in the bath and the start of the oscillating movements, but a lengthy delay is may not be desired for the sake of a swift performance of the method. The vibrating body acts on the bath, i.e., it stands in contact with the bath by at least part of its surface. There occurs primarily an acting of force or pressure on the bath in the contact area. But the vibrating body may also be a kind of piston, which is moved in a cylindrically shaped segment of the vessel, one end face of the piston being in contact with the bath. Of course, a drive may be employed for the movement of the vibrating body, such as an electric drive.

After the impregnation period, the workpiece is removed from the bath. This may occur, once again, by moving a holding device with the workpiece out from the vessel or by moving the vessel downward in relation to the holding device. Optionally, further steps may occur for the removal of excess impregnating agent, such as a spinning off. Furthermore, steps for the hardening of the impregnating agent inside the pores of the workpiece may also follow. For example, the workpiece may be exposed to radiation or heated, depending on which conditions promote the hardening of the impregnating agent.

Owing to the oscillating movement of the vibrating body, which in turn leads to an oscillating pressure change within the bath, a region of the workpiece near the surface is also exposed to an oscillating pressure. Thus, there is a switching between partial vacuum and excess pressure, whereupon gas still present is pulled out from the pores in the partial vacuum phase, while in the excess pressure phase impregnating agent is forced into the pores. The partial vacuum phases and excess pressure phases alternate in an oscillating manner, while each phase may itself be short. One could say that the action in the method according to the present disclosure is based on the sum of the partial vacuum phases and the sum of the excess pressure phases. It has been found that this enables an effective impregnation, not inferior in quality to that of classical methods working with a longer lasting vacuum and/or longer lasting excess pressure. Furthermore, it has been found that a shorter impregnation period is needed as compared to the classical methods, i.e., the method according to the present disclosure is very time-efficient. Furthermore, the energy input is reduced as compared to classical methods. This is due on the one hand to the shorter duration, on the other hand due to the fact that oscillating and possibly slight pressure changes can be generated with less energy input than a permanent partial vacuum or excess pressure. Furthermore, the apparatus expense can be reduced, since no high-power pumps are needed to create a vacuum and/or excess pressure and also no particularly pressure-tight vessel is needed.

As already mentioned, the method according to the present disclosure makes do without a permanent effect of vacuum or excess pressure. A gas pressure prevails above the bath before, during, and/or after the introducing of the workpiece which differs from the atmospheric pressure by at most 10% and according to one form, is equal to the atmospheric pressure. Atmospheric pressure means here the air pressure prevailing in the surroundings, which is typically between 0.9 bar and 1 bar. The region above the bath, i.e., at its surface, may contain either air or another gas, such as an inert gas, depending on the requirements of the impregnating agent. The workpiece may be placed in the bath without having previously removed the air or gas from the pores of the workpiece by a vacuum—similar to the wet vacuum method of the prior art. Therefore, atmospheric pressure or a pressure differing slightly from atmospheric pressure may prevail before and during the introducing of the workpiece. Also after the introducing of the workpiece in the bath, atmospheric pressure (or a pressure differing slightly from this) may prevail outside or above the bath. This stands in contrast for example with the wet vacuum method as well as methods in which an excess pressure is generated above the impregnated bath in order to force the impregnating agent into the pores of the workpiece. The statements regarding the gas pressure above the bath refer to a time average, leaving out of account any pressure fluctuations limited in space and time, for example those due to sonic waves.

In order to better judge the effectiveness of the impregnation process, it is advantageous to determine a pressure amplitude within the bath. Even though it is possible for the pressure amplitude at the measurement site to differ from the pressure amplitude at the surface of the workpiece, it is still generally possible to obtain at least qualitative inferences as to the pressure relations prevailing there. Normally, the currently prevailing pressure is measured by a pressure sensor which makes contact with the bath, and the amplitude can be determined from its oscillating behavior over time. Normally a minimal value and a maximal value are measured and saved in memory and half of the difference of the two values is defined as the amplitude.

The impregnation period is determined in dependence on the determined pressure amplitude. That is, the length of the impregnation period or its ending depends on which pressure amplitude has been determined. Normally, this means qualitatively that a larger pressure amplitude leads to a shortening of the impregnation period. However, different forms of the method are conceivable here. Typically, the length of the impregnation period is less than 30 minutes.

For reasons of energy efficiency, it may be desired to halt the vibrating body after the end of the impregnation period. This may occur already before the workpiece is removed from the bath, or even thereafter. Alternatively, it would be conceivable to operate the vibrating body continuously, for example during a series production.

One may regard the vibrating body as an exciter of an oscillatory system comprising the bath, the workpiece and possibly also the vessel. This system has a resonance frequency at which a maximum oscillation amplitude occurs, manifested as a maximum pressure amplitude with respect to the bath. In general, it may be assumed that the impregnation process is enhanced in that the excitation occurs roughly with the resonance frequency. In order to utilize this, in one form, a control unit may change a movement frequency of the vibrating body in order to increase the pressure amplitude. The control unit may comprise a microprocessor, for example, which receives signals of the pressure sensor and for its part actuates the drive of the vibrating body. The control unit may actuate the vibrating body for example with a certain initial frequency and ascertain the pressure amplitude. It may then increase or decrease the frequency and once again ascertain the pressure amplitude. If the pressure amplitude is decreased by the frequency change, the control unit makes a frequency change in the opposite direction. If this leads to an increasing of the pressure amplitude, the frequency may again be changed in the same direction. Otherwise, a frequency change may be done with smaller increments. Of course, this is only one possible procedure and other strategies are also conceivable for finding the resonance frequency. In some cases, the resonance frequency also does not even need to be reached, but rather it may be enough to change the frequency in the direction of the resonance frequency.

As already indicated above, the length of the impregnation period may depend on the pressure amplitude. According to one form, the control unit ends the impregnation period when the pressure amplitude has reached a predetermined threshold value. This threshold value may depend on the size and material of the workpiece or the type of a possibly preceding additive manufacturing method. A dependency on the type of impregnating agent is also conceivable. In any case, the threshold value is seen as being an indicator that a satisfactory evacuation of the pores initially present in the workpiece has occurred and that the pores so evacuated have been filled sufficiently with impregnating agent. When the threshold value has been reached, the control unit establishes the end of the impregnation period either directly or with a certain delay. If the threshold value is exceeded for a lengthy time and/or in a significant manner, this might result in damaging of the workpiece or the impregnation device.

As already explained above, it is unnecessary to create a lasting vacuum or excess pressure in the method according to the present disclosure. For this reason, neither does the vessel generally need to be closed pressure-tight. Optionally, however, it may be provided that the vessel is closed after introducing the workpiece. The closure can be done for example by an access hatch which closes an opening through which the workpiece is introduced into the vessel. The vessel may be closed liquid-tight or even gas-tight.

According to one form of the method, the workpiece is introduced into a first chamber of the vessel, which stands in communication via a connection channel with a second chamber, in which the vibrating body is disposed. The second chamber, as indicated above, may form a kind of cylinder for a piston-shaped vibrating body. The connection channel constitutes a region whose cross section is narrower than the cross sections of the first and second chamber.

In one form of the present disclosure, the pressure amplitude is determined with respect to the first chamber. This should be understood to mean that the pressure measurement on which the determination of the pressure amplitude is based is performed in the first chamber and that a pressure amplitude prevailing in the first chamber is determined. This is advantageous inasmuch as the measurement of the pressure amplitude in the first chamber has a closer relationship to the pressure amplitude prevailing at the surface of the workpiece than that in the second chamber. In particular, it is conceivable that, due to dampening effects, the amplitude in the second chamber, near the vibrating body, is much larger than at greater distance from it. In this case, a measurement in the second chamber may falsify the result.

Further areas of applicability will become apparent from the description provided herein. It should be understood that the description and specific examples are intended for purposes of illustration only and are not intended to limit the scope of the present disclosure.

DRAWINGS

Figure 2:
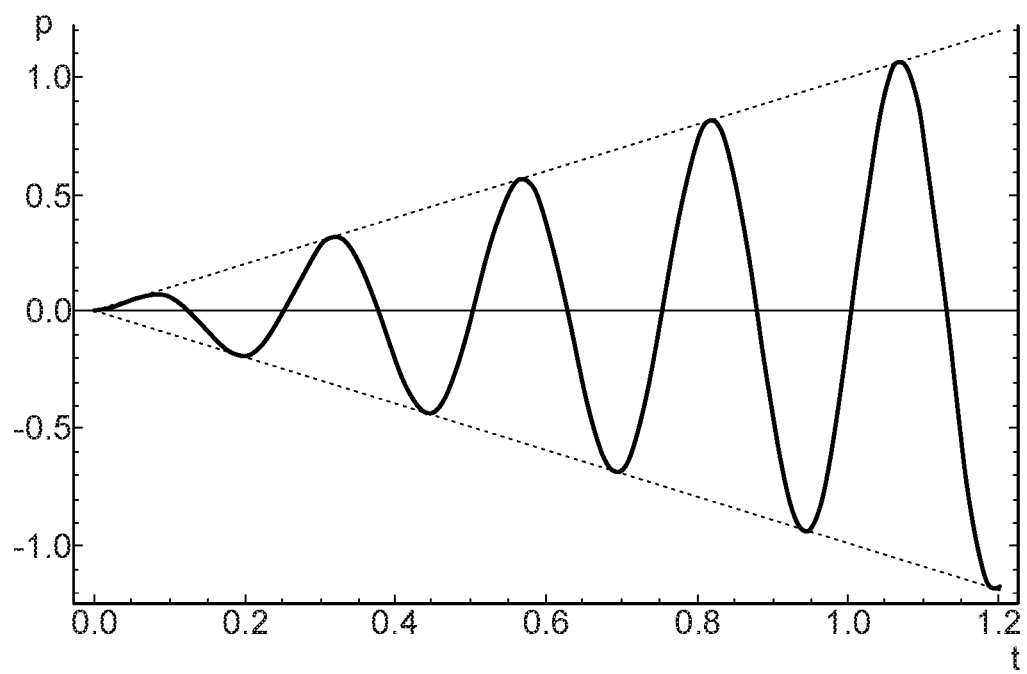

In order that the disclosure may be well understood, there will now be described various forms thereof, given by way of example, reference being made to the accompanying drawings, in which:

FIG. 1 a schematic representation of a device to carry out the method according to the present disclosure; and FIG. 2 is a graph illustrating a measured pressure plotted against time according to the teachings of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

FIG. 1 shows in schematic form an impregnation system 1, with which the method according to the present disclosure can be carried out. The impregnation system 1 comprises a vessel 2, which can be closed by a movable cover 3. Inside the vessel 2 are formed a larger first chamber 4 and a smaller second chamber 6, which is connected to the first chamber 4 by a connection channel 5. Both chambers 4, 6 as well as the connection channel 5 are filled with a bath 7 of impregnating agent. The impregnating agent may be, e.g., a resin. Adjacent to the first chamber 4 are arranged a pressure sensor 8 as well as a resonance sensor 9, which are connected to a control unit 10, afterwards also called a CPU 10. The CPU 10 receives measurement values of the sensors 8, 9. In turn, it actuates an electric drive 11, which drives a piston 12 in the second chamber 6. The resonance sensor 9 is optional here and may also be left out.

The system 1 is designed for the impregnation of additively manufactured workpieces 20, which may be prototypes, for example. After the workpiece 20 has been manufactured by FDM or SLS, for example, it still has a multitude of tiny pores so that it is neither gas-tight nor liquid-tight. For applications in which such a tightness is desired, the workpiece 20 is impregnated as follows:

First of all, the workpiece 20 is placed or received by a holding device 13, represented here schematically.

The workpiece 20 is then introduced into the bath 7 by lowering the holding device 13 into the vessel 2. No evacuation is done for the workpiece 20, but instead atmospheric pressure prevails above the bath 7 before and during the introduction.

After the workpiece 20 has been arranged in a predetermined position in the vessel 2 and the cover 3 has been closed, the CPU 10 actuates the drive 11 so that it moves the piston 12 in oscillation with a predetermined starting frequency. The movement may be sinuosoidal. The piston 12 acts on the bath 7 with an oscillating pressure, resulting on the whole in an oscillating pressure change within the bath. This oscillating pressure change is propagated via the second chamber 6 and the connection channel 5 into the first chamber 4. This results in oscillating pressure changes in the area of the surface of the workpiece 20, i.e., a change occurs between vacuum, resulting in an evacuating of the pores inside the workpiece 20, and excess pressure, resulting in a penetration of impregnating agent into the pores.

Furthermore, these pressure changes are registered by the pressure sensor 8. The optional resonance sensor 9 can detect the frequency of the pressure change. The CPU 10 thus obtains a feedback as to the pressure changes caused by the movement of the piston 12. In particular, by comparing the minimal and maximal values, a pressure amplitude can be determined. This pressure amplitude depends on the one hand on the movement amplitude of the piston 12, but also and primarily on its movement frequency. Starting with the initial frequency, the CPU 10 begins changing the movement frequency in order to increase the pressure amplitude. When the movement frequency nears a resonance frequency of the system, the determined pressure amplitude increases greatly, as reproduced in simplified form in FIG. 2, which plots the pressure p measured inside the bath 7 as a function of the time t. When the movement frequency of the piston 12 reaches the resonance frequency or comes sufficiently close to it, the pressure amplitude crosses a predetermined threshold value, which is evaluated by the CPU as a sign that a sufficient impregnation of the workpiece 20 has been achieved by the alternation of vacuum and excess pressure. As soon as this is the case, the CPU halts the drive 11 and the impregnated workpiece 20 can be removed by the holding device 13 from the vessel 2. The halting of the drive 11 inhibits possible damage of the workpiece 20 and/or the impregnation system 1.

There may then occur an optional spinning off of excess impregnating agent from the surface of the workpiece 20. Depending on the kind of impregnating agent, different means (radiation, heat, etc.) may be employed to initiate or hasten the hardening of the impregnating agent.

The present disclosure also comprises the use of the described impregnation system 1 for the impregnation of additively manufactured workpieces 20.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:
1. An impregnation method comprising:
    providing a workpiece to be impregnated;
    placing at least part of the workpiece in a first chamber of a vessel containing a bath of impregnating agent;
    oscillating movement of a piston-shaped vibrating body arranged in a second chamber of the vessel during an impregnation period, wherein the first chamber of the vessel is in communication via a connection channel with the second chamber, the second chamber is a cylinder for the piston-shaped vibrating body, and the piston-shaped vibrating body is configured to create oscillating pressure changes and pressure amplitude changes inside the bath by acting on the bath; and removing the workpiece from the bath after the impregnation period.

2. The impregnation method as claimed in claim 1, wherein at least one of before, during, and after introducing the workpiece, a gas pressure of at most 10% from atmospheric pressure prevails above the bath.

3. The impregnation method as claimed in claim 1, wherein at least one of before, during, and after introducing the workpiece, a gas pressure equal to atmospheric pressure prevails above the bath.

4. The impregnation method as claimed in claim 1, wherein a pressure amplitude is determined within the bath.

5. The impregnation method as claimed in claim 1, wherein the impregnation period is determined based on a determined pressure amplitude.

6. The impregnation method as claimed in claim 1, wherein the vibrating body is halted after the impregnation period ends.

7. The impregnation method as claimed in claim 1, wherein a control unit changes a movement frequency of the vibrating body to increase pressure amplitude.

8. The impregnation method as claimed in claim 7, wherein the control unit ends the impregnation period when the pressure amplitude reaches a predetermined threshold value.

9. The impregnation method as claimed in claim 1, wherein the vessel is closed after placing the workpiece in the vessel.

10. The impregnation method as claimed in claim 1, wherein a pressure amplitude is measured in the first chamber.

* * * * *